(12) United States Patent
Chen (10) Patent No.: US 10,627,658 B2
(45) Date of Patent: Apr. 21, 2020

(54) LIQUID CRYSTAL PANEL INCLUDING GOA CIRCUIT AND DRIVING METHOD THEREOF

(71) Applicant: SHENZHEN CHINA STAR OPTOELECTRONICS TECHNOLOGY CO., LTD., Shenzhen, Guangdong (CN)

(72) Inventor: Shuai Chen, Shenzhen (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/321,987

(22) PCT Filed: Sep. 11, 2018

(86) PCT No.: PCT/CN2018/105088
§ 371 (c)(1),
(2) Date: Jan. 30, 2019

(87) PCT Pub. No.: WO2020/019424
PCT Pub. Date: Jan. 30, 2020

(65) Prior Publication Data
US 2020/0033653 A1    Jan. 30, 2020

(30) Foreign Application Priority Data
Jul. 27, 2018 (CN) .......................... 2018 1 0839461

(51) Int. Cl.
*G02F 1/133* (2006.01)
*G09G 3/36* (2006.01)
(Continued)

(52) U.S. Cl.
CPC .... *G02F 1/13306* (2013.01); *G02F 1/133348* (2013.01); *G02F 1/136286* (2013.01); *G09G 3/3648* (2013.01)

(58) Field of Classification Search
CPC .......... G02F 1/13306; G02F 1/136286; G02F 1/133348; G09G 3/3648
See application file for complete search history.

(56) References Cited

U.S. PATENT DOCUMENTS

2017/0285374 A1* 10/2017 Li ........................ G02F 1/1303
2018/0046048 A1*  2/2018 Zhao ....................... G11C 19/28
(Continued)

FOREIGN PATENT DOCUMENTS

| CN | 101944322 A | 1/2011 |
| CN | 104361852 A | 2/2015 |

(Continued)

*Primary Examiner* — Andrew Sasinowski
(74) *Attorney, Agent, or Firm* — Maschoff Brennan (57) ABSTRACT

There provides a liquid crystal panel including a GOA circuit and a driving method thereof, the GOA circuit including a plurality of single-level GOA circuit units that are cascaded, wherein each single-level GOA circuit unit includes a pull-down maintaining unit, the pull-down maintaining unit including a first transistor having a gate connected to a first node, a source connected to a present-level pre-charging node, and a drain connected to a low supply voltage wire; and a second transistor having a gate connected to an upper-level pre-charging node so as to receive a pre-charging signal from the upper-level pre-charging node and a drain connected to the low supply voltage wire, wherein the second transistor is configured to turn off the first transistor in response to an upper level pre-charging signal before the present-level pre-charging node is precharged.

10 Claims, 4 Drawing Sheets

(51) Int. Cl.
    *G02F 1/1362*     (2006.01)
    *G02F 1/1333*     (2006.01)

(56) References Cited

U.S. PATENT DOCUMENTS

2018/0090087 A1*   3/2018   Shi ..................... G09G 3/3648
2018/0174545 A1*   6/2018   Li ...................... G09G 3/3696

FOREIGN PATENT DOCUMENTS

| CN | 107403602 A | 11/2017 |
| KR | 10-2018-0074169 A | 7/2018 |

\* cited by examiner

…

LIQUID CRYSTAL PANEL INCLUDING GOA CIRCUIT AND DRIVING METHOD THEREOF

TECHNICAL FIELD

The present invention relates to a field of display technique, and more particularly, to a liquid crystal panel including a GOA (Gate Driver On Array) circuit and a driving method thereof.

BACKGROUND ART

A liquid crystal display has now been widely applied to products such as laptop computers, personal digital assistants (PDAs), flat-screen TVs, mobile phones, etc. for its advantages such as low radiation, small size and low power consumption. A traditional liquid crystal display drives a chip on a display panel by using an external driving chip so as to display an image, but in order to reduce the number of elements and manufacturing cost, it has been gradually developed that a driving circuit structure is directly manufactured on the display panel by using, for example, a GOA technology.

The GOA technology is to integrate a gate driving circuit of a TFT LCD (Thin Film Transistor Liquid Crystal Display) on a glass substrate to form scan driving for a liquid crystal panel. Compared with the traditional driving technology using a COF (Chip On Flex/Film), the GOA technology may reduce the manufacturing cost significantly and is highly advantageous to improving product capacity for omitting manufacturing procedure of bonding of the COF at a Gate side. Therefore, the GOA is a key technology in future development of liquid crystal panels.

Figure 1:
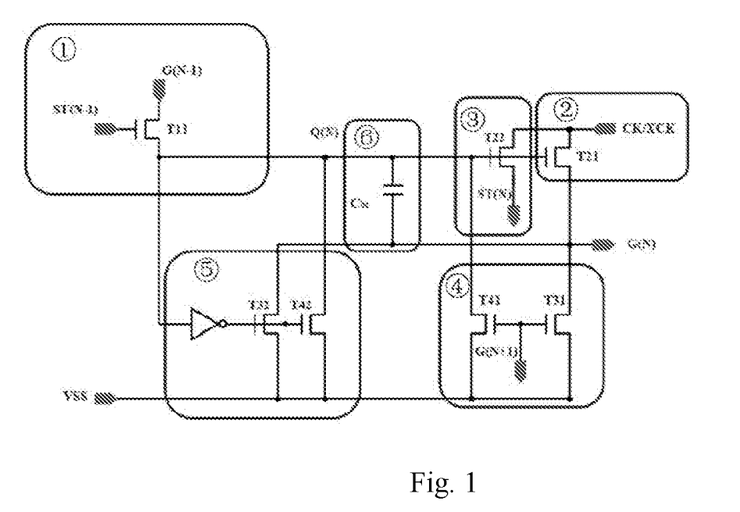
FIG. 1 is a diagram of a single-level GOA circuit unit in the prior art.

As illustrated in FIG. 1, a GOA circuit of the existing liquid crystal panel generally includes a plurality of single-level GOA circuit units that are cascaded, each of which corresponds to a scan driving wire of a corresponding level. Each single-level GOA circuit unit may include a pull-up control unit ①, a pull-up unit ②, a signal downward transmission unit ③, a pull-down unit ④, a pull-down maintaining unit ⑤ and a bootstrap capacitor ⑥.

In FIG. 1, the pull-up control unit ① is mainly used for implementing pre-charging for a pre-charging node Q(N), and usually, a carry signal ST(N−1) and a scan driving signal G(N−1) from an upper-level GOA circuit unit are input thereto. The pull-up unit ② is mainly used for improving a potential of a present-level scan driving signal G(N). The signal downward transmission unit ③ is mainly used for controlling on and off of transmitting signals to a lower-level GOA circuit unit. The pull-down unit ④ is mainly used for pulling potentials of the pre-charging node Q(N) and the present-level scan driving signal G(N) down to a low supply voltage VSS. The pull-down maintaining unit ⑤ is mainly used for maintaining potentials of the pre-charging node Q(N) and the present-level scan driving signal G(N) unchanged at the low supply voltage VSS. The bootstrap capacitor ⑥ is mainly used for providing and maintaining the potential of the pre-charging node Q(N), and it is helpful for the pull-up unit ② to output the scan driving signal G(N).

Figure 2:
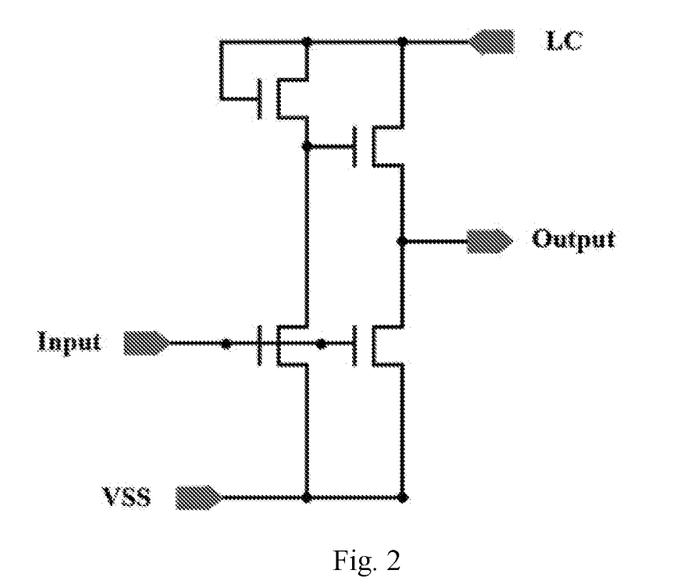
FIG. 2 is a circuit diagram of a Darlington inverter included in a pull-down maintaining unit of FIG. 1.

The pull-down maintaining unit ⑤ actually includes an inverter. For example, the pull-down maintaining unit ⑤ may adopt a Darlington inverter configuration, and a specific circuit structure thereof is illustrated in FIG. 2. The Darlington inverter may include four thin film transistors and has an Input terminal and an Output terminal. If a control signal LC is set to be a high potential signal all the time and the low supply voltage VSS is set to be a low potential signal all the time, when a high potential signal is input through the Input terminal, a low potential signal is output through the Output terminal, and when a low potential signal is input through the Input terminal, a high potential signal is output through the Output terminal. When the pull-down maintaining unit ⑤ includes a Darlington inverter as illustrated in FIG. 2, a specific circuit structure thereof may be as illustrated in FIG. 3.

Figure 3:
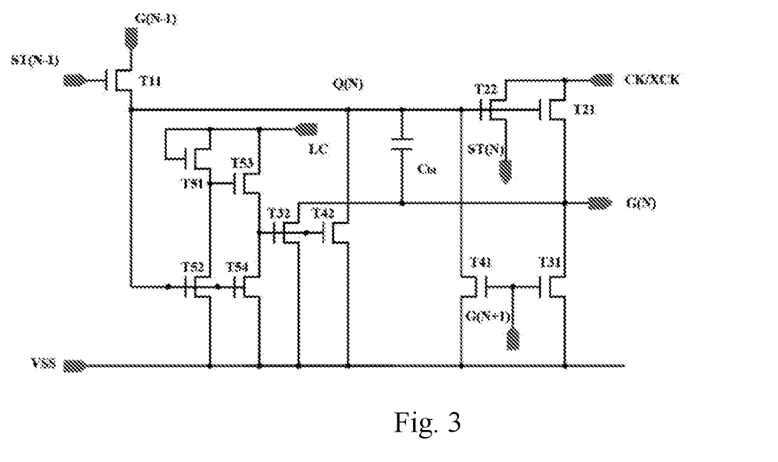
FIG. 3 is a detailed circuit diagram of FIG. 1.
Figure 4:
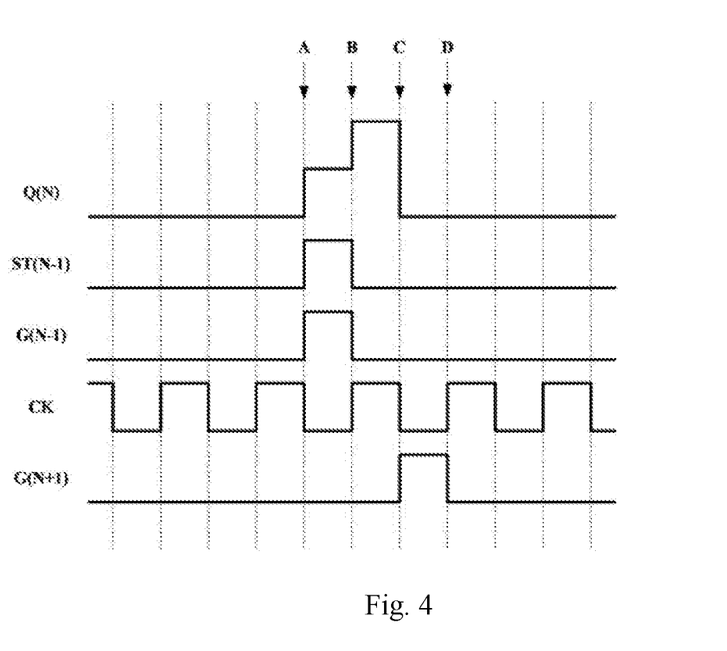
FIG. 4 is an oscillogram of a pre-charging node of FIG. 3.

FIG. 4 illustrates a signal wave of the pre-charging node Q(N) in FIG. 3. Hereinafter, the technical problem faced by the present application will be stated by referring to FIGS. 3 and 4.

Referring to FIG. 4, the pre-charging node Q(N) is in a low potential before point A. At this time, transistors T52 and T54 are in an off state, a transistor T42 is in an on state, and the pre-charging node Q(N) continues to be pulled down by a low supply voltage wire VSS through the transistor T42. After point A and before point B, the carry signal ST(N−1) and the scan driving signal G(N−1) from the upper-level GOA circuit unit are in a high potential, a transistor T11 is in an on state, and the pre-charging node Q(N) is charged to a certain high potential through the transistor T11. At this time, transistors T52 and T54 are in an off state, a transistor T42 is in an off state, and the potential of the pre-charging node Q(N) is not affected by the low supply voltage wire VSS. After point B and before point C, a clock signal CK input to the pull-up unit is changed to a high potential from a low potential, and a bootstrap capacitor Cbt enables the pre-charging node Q(N) to be pulled to a certain higher potential under the function of boot strap. At this time, transistors T52 and T54 are in an on state, the transistor T42 is in an off state, and the potential of the pre-charging node Q(N) is not affected by the low supply voltage wire VSS. After point C and before point D, the scan driving signal G(N+1) from the lower-level GOA circuit unit is in a high potential, the transistor T41 is in an on state, and the pre-charging node Q(N) is pulled down to the low supply voltage wire VS S through the transistor T41. After that, the situation is the same to that before point A since the pre-charging node Q(N) continues to be in a low potential and the potential thereof continues to be pulled down by the low supply voltage wire VSS.

Here, it needs to pay close attention to the conditions of the potential of the pre-charging node Q(N) before and after point A. Actually, there exist two conditions of mutual restraint this process. Specifically speaking, when the transistor T11 is in an on state, the pre-charging node Q(N) is pre-charged to a high potential, however, this process is not completed instantly, but completed in a period of time. Thus, when the pre-charging node Q(N) is pre-charged to a certain intermediate potential, the transistors T52 and T54 are not completely in an on state, but only turned on faintly, since the potential is not high enough yet. Correspondingly, the transistor T42 will not be completely in an off state either, but only turned off faintly, as a result, it is not possible to make the pre-charging node Q(N) to be completely isolated from the low supply voltage wire VS S through the transistor T42, so that the potential of the pre-charging node Q(N) will be pulled down.

In brief, a function of the transistor T11 is to pull the pre-charging node Q(N) to a high potential, while a function of the transistor T42 is to pull the pre-charging node Q(N) to a low potential. In a long-term use of a device, such a mutually restrained charging condition will lead to a problem on reliability and cause malfunction of a GOA circuit.

SUMMARY

The embodiments of the present invention provide a liquid crystal panel including a GOA circuit and a driving method thereof. The GOA circuit includes a plurality of single-level GOA circuit units that are cascaded. Embodiments of the present invention redesign a structure of an inverter included in a pull-down maintaining unit of each single-level GOA circuit unit, so that the problem that a potential of the pre-charging node is pulled down unexpectedly in the pre-charging process may be avoided, which improves the reliability and stability of the GOA circuit.

One aspect of embodiments of the present invention discloses a liquid crystal panel including a GOA circuit, the GOA circuit including a plurality of single-level GOA circuit units that are cascaded, and each single-level GOA circuit unit including a pull-down maintaining unit, the pull-down maintaining unit including a first transistor having a gate connected to a first node, a source connected to a present-level pre-charging node, and a drain connected to a low supply voltage wire; and a second transistor having a gate connected to an upper-level pre-charging node so as to receive a pre-charging signal from the upper-level pre-charging node and a drain connected to the low supply voltage wire, wherein the second transistor configured to turn off the first transistor in response to an upper level pre-charging signal before the present-level pre-charging node is pre-charged.

Further, a source of the second transistor may be connected to the first node.

Further, the pull-down maintaining unit may further include an inverter having an input terminal connected to the present-level pre-charging node and an output terminal connected to the first node.

Further, the inverter may include a third transistor having a source and a gate connected in diode and through which a control signal is received, and a drain connected to a source of a fourth transistor and a gate of a fifth transistor; the fourth transistor having a gate connected to the input terminal, a source connected to a drain of the third transistor, and a drain connected to the low supply voltage wire; the fifth transistor having a gate connected to the drain of the third transistor, a source connected to the source of the third transistor and through which a control signal is received, and a drain connected to the output terminal; and a sixth transistor having a gate connected to the gate of the fourth transistor, a source connected to the output terminal and a drain connected to the low supply voltage wire.

Further, each single-level GOA circuit unit may further include a pull-up control unit; the pull-up control unit may include a seventh transistor which may be configured to receive a carry signal from an upper-level GOA circuit unit through a gate thereof, receive a scan driving signal from the upper-level GOA circuit unit through a drain thereof, and have a source connected to a present-level pre-charging node.

Further, the pull-down maintaining unit may further include a third transistor having a source and a gate connected in diode and through which a control signal is received, wherein a drain of the third transistor is connected to a source of the second transistor, a source of a fourth transistor, and a gate of a fifth transistor; the fourth transistor having a gate connected to a source of the second transistor and a drain of the third transistor, a source connected to a source of the third transistor and through which a control signal is received, and a drain connected to a first node; and the fifth transistor having a gate connected to a present-level pre-charging node, a source connected to a first node, and a drain connected to the low supply voltage wire.

Further, the pull-down maintaining unit may further include a sixth transistor having a gate connected to a gate of the first transistor and a first node, a source connected to a present-level scan driving wire, and a drain connected to the low supply voltage wire.

Another aspect of embodiments of the present invention discloses a method of driving a liquid crystal panel including a GOA circuit, the liquid crystal panel being the previously-mentioned liquid crystal panel, the method including: applying an upper-level pre-charging signal to a gate of a second transistor before a pre-charging period so as to turn on the second transistor; and in response to the turning on of the second transistor, turning off a first transistor so that a present-level charging node is electrically isolated from a low supply voltage wire.

Further, the method may further include partially overlapping a period of an upper-level pre-charging signal with that of a present-level pre-charging signal, so that in at least a portion of the pre-charging period, the upper-level pre-charging signal maintains an activation state, and the second transistor maintains a turned-on state in response to the upper-level pre-charging signal.

Further, the method may further include: in a period of scanning output, the upper-level pre-charging signal is deactivated, and the second transistor is turned off in response to deactivation of the upper-level pre-charging signal.

BRIEF DESCRIPTION OF THE DRAWINGS

The above and/or other targets and advantages will become more apparent from descriptions made on the embodiments, taken in conjunction with the accompanying drawings in which.

DETAILED DESCRIPTION OF EXEMPLARY EMBODIMENTS

Now, one or more exemplary embodiments of the present disclosure will be described in more details by referring to the accompanied drawings. The same drawing signs may be used for those components that are identical or corresponding, and repeated explanations are omitted.

The terms are used herein only for the purpose of describing a specific exemplary embodiment, with no intention to limit the concept of the present invention. As used herein, unless additionally specified in the context, otherwise a singular form of "a/an" and "said (the)" also intentionally includes a plural form. It should also be understood that, when the terms "contain" and "include" are used in the present description, it means the existence of the character, entity, step, operation, component, element and/or groups thereof, but that does not exclude the existence or addition of one or more other characters, entities, steps, operations, component, elements and/or the groups thereof.

Figure 5:
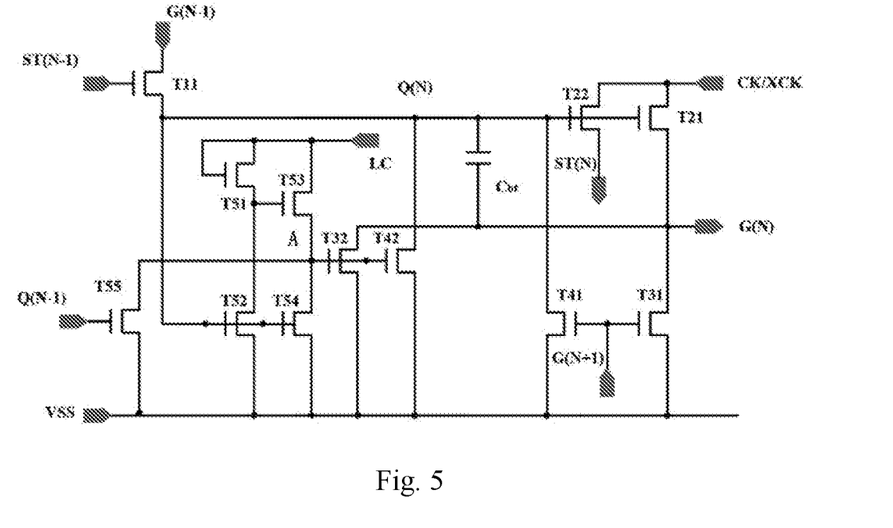
FIG. 5 is a circuit diagram of a single-level GOA circuit unit according to a first embodiment of the present invention.

FIG. 5 is a circuit diagram of a single-level GOA circuit unit according to a first embodiment of the present invention.

Referring to FIG. 5, a single-level GOA circuit unit of a liquid crystal panel including a GOA circuit according to embodiments of the present invention includes a pull-down maintaining unit 5. The pull-down maintaining unit 5 includes a first transistor T42 and a second transistor T55. A gate of the first transistor T42 is connected to a first node A, a source thereof is connected to a present-level pre-charging node Q(N), and a drain thereof is connected to a low supply voltage wire VSS. A gate of the second transistor T55 is connected to an upper-level pre-charging node Q(N–1) so as to receive a pre-charging signal from the upper-level pre-charging node Q(N–1). Here, in order to facilitate description, the pre-charging signal from the upper-level pre-charging node Q(N–1) is called as an upper-level pre-charging signal. A drain of the second transistor T55 is connected to the low supply voltage wire VSS, wherein the second transistor T55 is configured to turn off the first transistor T42 in response to the upper-level pre-charging signal before the present-level pre-charging node Q(N) is pre-charged.

Compared with the structure illustrated in FIG. 3, the single-level GOA circuit is unit of the liquid crystal panel according to embodiments of the present invention may turn off the first transistor T42 in response to the upper-level pre-charging signal before the present-level pre-charging node Q(N) is pre-charged, so that the pre-charging node Q(N) is enabled to be completely disconnected from the low supply voltage wire VSS, thereby preventing the pre-charging node Q(N) from being affected by a pull-down effect in the subsequent process of being pulled up.

Hereinafter, a structure of the liquid crystal panel including a single-level GOA circuit unit according to embodiments of the present invention will be described in details in conjunction with FIG. 5.

Referring to FIG. 5, the source of the second transistor T55 may be connected to the first node A. In one embodiment of the present invention, the pull-down maintaining unit 5 may further include an inverter having an input terminal connected to the present-level pre-charging node Q(N) and an output terminal connected to the first node A. For example, the inverter may be a Darlington inverter, and may have a structure as illustrated in FIG. 2.

In the present embodiment, as illustrated in FIG. 5, the inverter may include a third transistor T51, a fourth transistor T52, a fifth transistor T53 and a sixth transistor T54. The source and the gate of the third transistor T51 may be connected in diode and a control signal LC may be received through the gate and the source of the third transistor T51, and the drain of third transistor T51 may be connected to a source of the fourth transistor T52 and a gate of the fifth transistor T53. A gate of the fourth transistor T52 may be connected to the input terminal of the inverter, a source thereof may be connected to the drain of the third transistor T51 and a drain thereof may be connected to the low supply voltage wire VSS. A gate of the fifth transistor T53 may be connected to the drain of the third transistor T51, a source thereof may be connected to the source of the third transistor T51 and may receive a control signal LC, and a drain thereof may be connected to the output terminal of the inverter. A gate of the sixth transistor T54 may be connected to the gate of the fourth transistor T52, a source thereof may be connected to the output terminal of the inverter, and a drain thereof may be connected to the low supply voltage wire VSS.

Apart from the structure as described above, each single-level GOA circuit unit may further include a pull-up control unit 1. For example, the pull-up control unit 1 may include a seventh transistor T11 which may be configured to receive a carry signal ST (N–1) from an upper-level GOA circuit unit through a gate thereof, receive a scan driving signal G(N–1) from the upper-level GOA circuit unit through a drain thereof, and have a source which may be connected to a present-level pre-charging node Q(N). When the carry signal ST (N–1) from the upper-level GOA circuit unit is at a high level, a seventh transistor T11 may be turned on, so that the scan driving signal G(N–1) is input to the pre-charging node Q(N) to pre-charge the pre-charging node Q(N).

Moreover, each single-level GOA circuit unit may further include other units. For example, referring to FIG. 5, an $N^{th}$-level GOA circuit unit may further include a pull-up unit 2, a downward transmission unit 3, a pull-down unit 4, and a bootstrap capacitor Cbt 6. For example, the pull-up unit 2 may include an eighteenth transistor T21, wherein a gate of the eighteenth transistor T21 may be connected to a first electrode of the bootstrap capacitor Cbt 6 and a pre-charging node Q(N), a source of the eighteenth transistor T21 may be connected to a present-level scan driving wire so as to output a scan driving signal G(N), and a present-level clock signal CK(N) may be input to a drain of the eighteenth transistor T21. The downward transmission unit 3 may include a nineteenth transistor T22, wherein a gate of the nineteenth transistor T22 may be connected to the gate of the eighteenth transistor T21, a drain of the nineteenth transistor T22 may be connected to the drain of the eighteenth transistor T21, and a source of the nineteenth transistor T22 may output a present-level carry signal ST(N) used to be transmitted to a lower-level GOA circuit unit.

The pull-up unit 2 is mainly used for improving a potential of the scan driving signal G(N). When the present-level scan driving wire is turned on, the pre-charging node Q(N) is in a high potential, at this time, the eighteenth transistor T21 and the nineteenth transistor T22 are turned on, and when the present-level clock signal CK(N) is at a high level, the present-level GOA circuit unit may send the carry signal ST(N) to the lower-level GOA circuit unit, and may output the present-level scan driving signal G(N).

The bootstrap capacitor Cbt 6 uses characteristic that voltages at two ends of a capacitor cannot change suddenly. When there is a certain voltage maintained at two ends of the capacitor, if a voltage at a negative end of the capacitor is boosted, an initial voltage difference is still maintained between a voltage at a positive end and that at the negative end, that is, the voltage at the positive end is boosted by the negative end. As illustrated in FIG. 5, one end of the bootstrap capacitor Cbt 6 is connected to the pre-charging node Q(N), and the other end is connected to the present-level scan driving wire, wherein the bootstrap capacitor Cbt 6 is mainly used for maintaining and improving the potential of the pre-charging node Q(N) so as to guarantee downward transmission of the carry signal and the output of the scan driving signal.

The pull-down unit 4 may include a twentieth transistor T31 and a twenty-first transistor T41, gates of the twentieth transistor T31 and the twenty-first transistor T41 may be connected with each other, and drains of the twentieth transistor T31 and the twenty-first transistor T41 may both be connected to the low supply voltage wire VSS. A source of the twentieth transistor T31 may be connected to the present-level scan driving wire, and a drain of the twenty-first transistor T41 may be connected to the pre-charging node Q(N). When the scan driving signal G(N+1) from the lower-level GOA circuit unit is input to the gates of the twentieth transistor T31 and the twenty-first transistor T41, the twentieth transistor T31 and the twenty-first transistor T41 may be turned on, so that potentials of the pre-charging node Q(N) and the scan driving signal G(N) are pulled down to the low supply voltage VSS.

Figure 6:
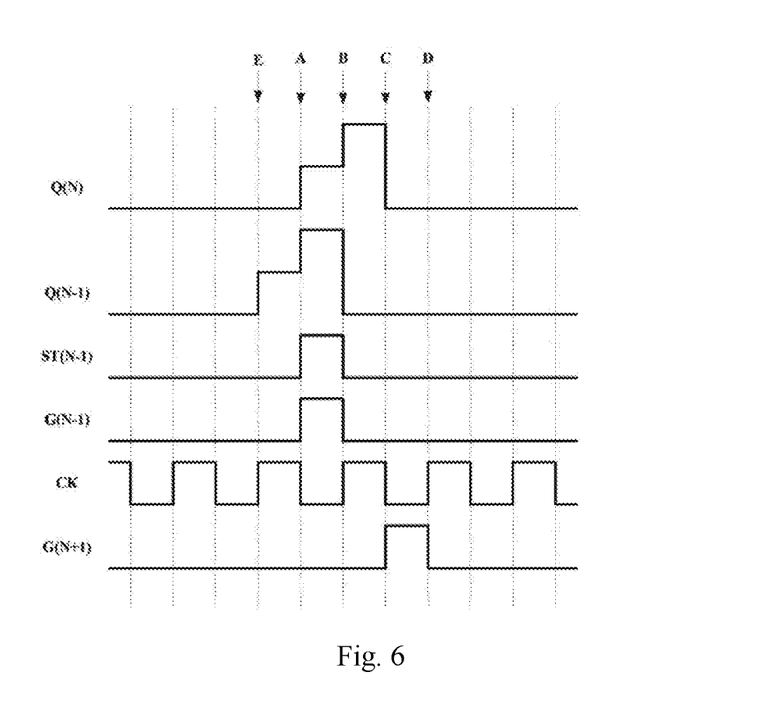
FIG. 6 is an oscillogram of a pre-charging node of FIG. 5.

FIG. 6 is an oscillogram of a pre-charging node of FIG. 5. Hereinafter, a method of driving a liquid crystal panel including a GOA circuit according to the first embodiment of the present invention will be described in details in conjunction with FIG. 6.

Referring to FIG. 6, the method of driving a liquid crystal panel including a GOA circuit according to the embodiment of the present invention includes: applying an upper-level pre-charging signal to a gate of a second transistor T55 before point A of a pre-charging period so as to turn on the second transistor T55; and in response to the turning on of the second transistor T55, turning off a first transistor T42 so that a present-level charging node Q(N) is electrically isolated from a low supply voltage wire VSS.

The method of driving a liquid crystal panel including a GOA circuit according to the embodiment of the present invention may turn off the first transistor T42 using the pre-charging signal from the upper-level pre-charging node Q(N−1) before the present-level pre-charging node Q(N) is pre-charged, so that the pre-charging node Q(N) is enabled to be electrically isolated from the low supply voltage wire VSS, thereby preventing the pre-charging node Q(N) from being affected by a pull-down effect in the subsequent process of being pulled up.

In one embodiment of the present invention, the method may further include: partially overlapping a period of an upper-level pre-charging signal with that of a present-level pre-charging signal, so that in at least a portion of the pre-charging period, the upper-level pre-charging signal is maintained in an activation state, and the second transistor is maintained in a turned-on state in response to the upper-level pre-charging signal. Still taking FIG. 6 as an example, a period of an upper-level pre-charging signal Q(N−1) may be partially overlapped with that of a present-level pre-charging signal Q(N), so that the first transistor T42 is turned off in advance before a start of the present-level pre-charging period from point A to point B, and it is guaranteed that the first transistor T42 has been completely in an off state during a period of time just beforethe start of the present-level pre-charging period. Although in the oscillogram of FIG. 6, compared to the upper-level pre-charging signal, the present-level pre-charging signal is delayed by ½, that is, they are overlapped with each other in half of the period, however, the inventive concept is not limited thereto, as long as the upper-level pre-charging signal is overlapped with the present-level pre-charging signal, it may be realized that the first transistor is turned off in advance using the upper-level pre-charging signal, thereby preventing the node Q(N) from still being subject to a pull-down effect after the start of the present-level pre-charging.

In one embodiment of the present invention, the method may further include: in a period of scanning output, deactivating the upper-level pre-charging signal is deactivated, and turning off the second transistor is turned off in response to the deactivation of the upper-level pre-charging signal. Still taking FIG. 6 as an example, in the period from point B to point C of the scanning output period, the upper-level pre-charging signal may be changed to a deactivation state from an activation state, and the second transistor T55 may be turned off in response to the deactivation of the upper-level pre-charging signal. At this time, since the present-level pre-charging node is still in a high potential, the first node A is in a low potential, and the first transistor T42 is maintained in a turned-off state.

Detailed description is further made in combination with FIGS. 5 and 6, before point E, the upper-level pre-charging node Q(N−1) and the present-level pre-charging node Q(N) are in a low potential, and at this time, the fourth transistor T52 and the sixth transistor T54 in the inverter of the pull-down maintaining unit 5 are in a turned-off state, the first transistor T42 is in a turned-on state, and the present-level pre-charging node Q(N) continues to be pulled down by the low supply voltage wire VSS through the first transistor T42.

After point E and before point A, the upper-level pre-charging node Q(N−1) is in a high potential, the second transistor T55 is in a turned-on state, the present-level pre-charging node Q(N) is in a low potential, and at this time, the fourth transistor T52 and the sixth transistor T54 are in a turned-off state, the first transistor T42 is in a turned-off state, and the potential of the present-level pre-charging node Q(N) is not affected by the low supply voltage wire VSS.

After point A and before point B, the carry signal ST(N−1) and the scan driving signal G(N−1) from the upper-level GOA circuit unit are in a high potential, the seventh transistor T11 is in a turned-on state, the present-level pre-charging node Q(N) is charged to a certain high potential through the seventh transistor T11, and at this time, the fourth transistor T52 and the sixth transistor T54 are in a turned-on state, the first transistor T42 is in a turned-off state, and the potential of the present-level pre-charging node Q(N) is not affected by the low supply voltage wire VSS.

After point B and before point C, the present-level clock signal CK input to the pull-up unit 2 is changed to a high potential from a low potential, and under the boot strap of the bootstrap capacitor Cbt, the present-level pre-charging node Q(N) is pulled up to a certain higher potential, at this time, the fourth transistor T52 and the sixth transistor T54 are in a turned-on state, the first transistor T42 is in a turned-off state, and the potential of the present-level pre-charging node Q(N) is not affected by the VSS.

After point C and before point D, the scan driving signal G(N+1) from the lower-level GOA circuit unit is in a high potential, the twenty-first transistor T41 is in a turned-on state, and the present-level pre-charging node Q(N) is pulled down to the low supply voltage wire VSS through the twenty-first transistor T41.

After that, the situation is the same to that before point E since the present-level pre-charging node Q(N) continues to be in a low potential and the potential thereof continues to be pulled down by the low supply voltage wire VSS.

In fact, the second transistor T55 is added in the single-level GOA circuit unit included in the liquid crystal panel according to the first embodiment of the present invention, and before the start point A of the present-level pre-charging period, the first transistor T42 is turned off in advance using the pre-charging signal from the upper-level pre-charging node Q(N−1), thereby avoiding the effect that the node Q(N) is pulled down to a low potential since the first transistor T42 is faintly turned on in the process of the present-level pre-charging node Q(N) being pulled up to be at a high potential through the seventh transistor T11 of the pull-up control unit 1.

Figure 7:
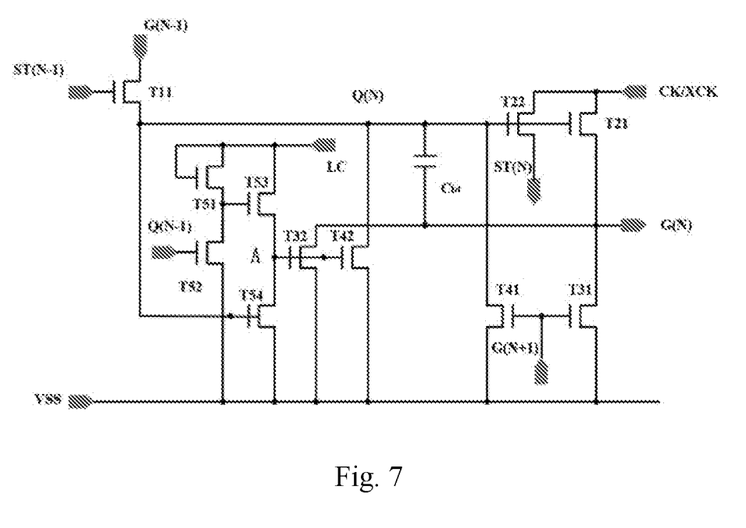
FIG. 7 is a circuit diagram of a single-level GOA circuit unit according to a second embodiment of the present invention.

FIG. 7 is a circuit diagram of a single-level GOA circuit unit according to the second embodiment of the present invention. Apart from the second transistor T55 being substituted by the second transistor T52, the circuit structure in FIG. 7 is basically identical to that in FIG. 5, thus, repeated descriptions will be omitted, and a difference therebetween will be described with extra emphasis.

Referring to FIG. 7, the pull-down maintaining unit 5 of the single-level GOA circuit unit according to the second embodiment includes a first transistor T42 and a second transistor T52, wherein, a gate of the first transistor T42 is connected to a first node A, a source of the first transistor T42 is connected to a present-level pre-charging node Q(N), and a drain of the first transistor T42 is connected to the low supply voltage wire VSS. The gate of the second transistor T52 is connected to the upper-level pre-charging node Q(N−1) so as to receive a pre-charging signal from the upper-level pre-charging node Q(N−1), and the drain of the second transistor T52 is connected to the low supply voltage wire VSS.

In addition, in the present embodiment, the pull-down maintaining unit 5 may further include a third transistor T51, a fourth transistor T53 and a fifth transistor T54. The third transistor T51 has a source and a gate connected in diode and through which a control signal LC is received, wherein a drain of the third transistor T51 is connected to a source of the second transistor T52, a source of a fourth transistor T53, and a gate of a fifth transistor T54; the fourth transistor T53 has a gate connected to a source of the second transistor T52 and a drain of the third transistor T51, a source connected to a source of the third transistor T51 and through which a control signal LC is received, and a drain connected to a first node A; the fifth transistor T54 has a gate connected to a present-level pre-charging node Q(N), a source connected to a first node A, and a drain connected to a low supply voltage wire VSS.

The second transistor T52 is configured to turn off the first transistor T42 in response to the upper-level pre-charging signal before the present-level pre-charging node Q(N) is pre-charged, so that the pre-charging node Q(N) is enabled to be completely disconnected from the low supply voltage wire VSS, so as to prevent the pre-charging node Q(N) from being subject to a unexpected pull-down effect in the subsequent process of being pulled up.

In one embodiment, the pull-down maintaining unit may further include a sixth transistor. For example, the pull-down maintaining unit 5 may further include a sixth transistor T32 as illustrated in FIG. 7, or may further include a transistor T32 as illustrated in FIG. 5. Taking the sixth transistor T32 as illustrated in FIG. 7 as an example, a gate of the sixth transistor T32 may be connected to the gate of the first transistor T42 and the first node A, a source of the sixth transistor T32 may be connected to the present-level scan driving wire, and a drain thereof may be connected to the low supply voltage wire VSS.

Hereinafter, the method of driving a liquid crystal panel including a GOA circuit according to the second embodiment of the present invention will be described in details in conjunction with FIG. 6.

The basic inventive concept of driving the circuit as illustrated in FIG. 7 is also to effectively turn off the first transistor T42 in the pull-down maintaining unit 5 before the pre-charging node Q(N) is charged to a high potential through the seventh transistor T11 of the pull-up control unit 1.

The method of driving a liquid crystal panel including a GOA circuit according to the second embodiment includes: applying an upper-level pre-charging signal from an upper-level pre-charging node Q(N−1) to a gate of a second transistor T52 before a start point A of a present-level pre-charging period so as to turn on the second transistor T52; and in response to the turning on of the second transistor T52, turning off a first transistor T42, so that a present-level charging node Q(N) is electrically isolated from a low supply voltage wire VSS. For example, referring to FIG. 6, before point A, when the upper-level pre-charging node Q(N−1) is in a certain high potential, the second transistor T52 may be turned on, and the gate of the fourth transistor T53 may be in a turned-off state by being applied with a low potential from the low supply voltage wire VSS. After point A and before point B, when the upper-level pre-charging node Q(N−1) is in a certain higher potential, the fourth transistor T53 may still be in an off state. At this time, when the present-level pre-charging node Q(N) is charged to a certain intermediate potential through the seventh transistor T11, according to the prior art, the fifth transistor T54 may be in an incompletely turned-on state or in a faintly turned-on state due to the potential of the gate not being sufficiently high, which causes that the first node A cannot be sufficiently pulled down to a sufficiently low level by the low supply voltage wire VSS, and thus causes that the first transistor T42 cannot be completed turned off, and still has a pull-down effect on the node Q(N). However, according to the present embodiment, at this time, since the fourth transistor T53 has been completely turned off, the gate potential of the first transistor T42 is no longer subject to a mutual restraint effect of the fourth transistor T53 and the fifth transistor T54, and thus can be better turned off, thereby improving reliability and stability of a GOA circuit.

The previously described contents are examples of the present invention and should not be explained to limit the present invention. Although some embodiments of the present invention have been described, those skilled in the art will easily understand that many modifications may be made in the embodiments without departing from features and aspects of the present invention in substance. Therefore, all such modifications are intended to be included in scope of the present invention defined by the claims and equivalents thereof

What is claimed is:

1. A liquid crystal panel comprising a GOA circuit, wherein the GOA circuit comprises a plurality of single-level GOA circuit units that are cascaded, each single-level GOA circuit unit comprises a pull-down maintaining unit, the pull-down maintaining unit comprising:
   a first transistor having a gate connected to a first node, a source connected to a present-level pre-charging node, and a drain connected to a low supply voltage wire; and
   a second transistor having a gate connected to an upper-level pre-charging node so as to receive a pre-charging signal from the upper-level pre-charging node, and a drain connected to the low supply voltage wire,
   wherein the second transistor is configured to turn off the first transistor in response to an upper-level pre-charging signal before the present-level pre-charging node is pre-charged.

2. The liquid crystal panel of claim 1, wherein a source of the second transistor is connected to the first node.

3. The Liquid crystal panel of claim 2, wherein the pull-down maintaining unit further comprises an inverter having an input terminal and an output terminal, wherein the input terminal is connected to the present-level pre-charging node, and the output terminal is connected to the first node.

4. The liquid crystal panel of claim 3, wherein the inverter comprises:

a third transistor having a source and a gate connected in diode and through which a control signal is received, and a drain connected to a source of a fourth transistor and a gate of a fifth transistor;

the fourth transistor having a gate connected to the input terminal, a source connected to a drain of the third transistor, and a drain connected to the low supply voltage wire;

the fifth transistor having a gate connected to the drain of the third transistor, a source connected to the source of the third transistor and through which the control signal is received, and a drain connected to the output terminal; and a sixth transistor having a gate connected to the gate of the fourth transistor, a source connected to the output terminal, and a drain connected to the low supply voltage wire.

5. The liquid crystal panel of claim 4, wherein the each single-level GOA circuit unit further comprises a pull-up control unit, and the pull-up control unit comprises a seventh transistor configured to receive a carry signal from an upper-level GOA circuit unit through a gate thereof, receive a scan driving signal from the upper-level GOA circuit unit through a drain thereof, and have a source connected to the present-level pre-charging node.

6. The Liquid crystal panel of claim 1, wherein the pull-down maintaining unit further comprises:

a third transistor having a source and a gate connected in diode and through which a control signal is received, wherein a drain of the third transistor is connected to the source of the second transistor, a source of a fourth transistor and a gate of a fifth transistor;

the fourth transistor having a gate connected to the source of the second transistor and the drain of the third transistor, a source connected to the source of the third transistor and through which the control signal is received, and a drain connected to the first node; and the fifth transistor having a gate connected to the present-level pre-charging node, a source connected to the first node, and a drain connected to the low supply voltage wire.

7. The Liquid crystal panel of claim 6, wherein the pull-down maintaining unit further comprises:

a sixth transistor having a gate connected to the gate of the first transistor and the first node, a source connected to a present-level scan driving wire, and a drain connected to the low supply voltage wire.

8. A method of driving a liquid crystal panel comprising a GOA circuit, the liquid crystal panel being the liquid crystal panel of claim 1, the method comprising:

applying an upper-level pre-charging signal to a gate of a second transistor so as to turn on the second transistor before a pre-charging period; and turning off a first transistor in response to the turning on of the second transistor, so that a present-level pre-charging node is electrically isolated from a low supply voltage wire.

9. The method of claim 8, wherein a period of the upper-level pre-charging signal is partially overlapped with that of the present-level pre-charging signal, so that:

in at least a portion of the pre-charging period, the upper-level pre-charging signal maintains an activation state, and the second transistor maintains a turned-on state in response to the upper-level pre-charging signal.

10. The method of claim 9, wherein in a period of scanning output, the upper-level pre-charging signal is deactivated, and the second transistor is turned off in response to deactivation of the upper-level pre-charging signal.

* * * * *